US011056209B2

(12) United States Patent
Katsurai et al.

(10) Patent No.: US 11,056,209 B2
(45) Date of Patent: Jul. 6, 2021

(54) TRACK-AND-HOLD CIRCUIT

(71) Applicant: Nippon Telegraph and Telephone Corporation, Tokyo (JP)

(72) Inventors: Hiroaki Katsurai, Musashino (JP); Naoki Miura, Musashino (JP); Hiroyuki Fukuyama, Musashino (JP); Hideyuki Nosaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/978,356

(22) PCT Filed: Mar. 4, 2019

(86) PCT No.: PCT/JP2019/008341
§ 371 (c)(1),
(2) Date: Sep. 4, 2020

(87) PCT Pub. No.: WO2019/172171
PCT Pub. Date: Sep. 12, 2019

(65) Prior Publication Data
US 2021/0012848 A1    Jan. 14, 2021

(30) Foreign Application Priority Data

Mar. 8, 2018  (JP) ............................... JP2018-042363

(51) Int. Cl.
*G11C 27/02*    (2006.01)
*H03K 5/13*    (2014.01)
*H03M 1/12*    (2006.01)

(52) U.S. Cl.
CPC .................................... *G11C 27/02* (2013.01)

(58) Field of Classification Search
CPC combination set(s) only.
See application file for complete search history.

(56) References Cited

U.S. PATENT DOCUMENTS 7,206,062 B2 * 4/2007 Asbrock ................. G01S 7/483
356/4.01
7,751,507 B2 * 7/2010 Son ................... H03M 13/6597
375/341

(Continued)

FOREIGN PATENT DOCUMENTS

| JP | 2009-230842 A  | 10/2009 |
| WO | 2010/032726 A1 | 3/2010  |
| WO | 2014/155635 A1 | 10/2014 |

OTHER PUBLICATIONS

Shahriar Shahramian et al., *A 40-GSamplse/Sec Track & Hold Amplifier in 0.1 μm SiGe BiCMOS Technology*, Compound Semiconductor IC (CSIC) Symposium (CSIC), Digest, Oct. 30, 2005, pp. 101-104.

(Continued)

*Primary Examiner* — An T Luu
(74) *Attorney, Agent, or Firm* — Workman Nydegger

(57) ABSTRACT

A track-and-hold circuit with a high sampling rate and reduced power consumption is provided. A track-and-hold circuit performing switching between a track mode in which a data signal that is equivalent to an input data signal is output and a hold mode in which a data signal which is input at a time of switching from the track mode to the hold mode is held and output, by using a clock signal, such that only the data signal in the hold mode is output, the track-and-hold circuit including: two sampling circuits configured to be connected in parallel to an input of the data signal and receive an in-phase data signal; a clock circuit configured to input a clock signal, which has a phase opposite to a phase of a clock signal input to one of the two sampling circuits, to the other of the two sampling circuits; and a multiplexer circuit configured to select and output a data output of either one of the two sampling circuits that is in the hold mode, by using the clock signal.

4 Claims, 5 Drawing Sheets

(56) References Cited

U.S. PATENT DOCUMENTS

| | | | | |
|---|---|---|---|---|
| 8,248,289 B2* | 8/2012 | Bright | ................ | H03M 1/1215 |
| | | | | 341/162 |
| 8,378,717 B1* | 2/2013 | Tsai | ................... | G11C 27/026 |
| | | | | 327/95 |
| 9,419,827 B2* | 8/2016 | Thakkar | ................ | H04L 7/0045 |
| 2001/0050624 A1* | 12/2001 | Nagaraj | ............. | H03M 1/0673 |
| | | | | 341/122 |
| 2011/0156759 A1 | 6/2011 | Noguchi | | |
| 2016/0013782 A1 | 1/2016 | Nakagawa | | |

OTHER PUBLICATIONS

Y. Bouvier et al., *A 1GSample/s, 15 GHz Input Bandwidth Master-Slave Track-&-Hold Amplifier in InP-DHBT Technology*, International Microwave Symposium (IMIS) 2009, Jun. 7, 2009, pp. 1137-1140.

International Search Report and Written Opinion dated Apr. 9, 2019, issued in PCT Application No. PCT/JP2019/008341, filed Mar. 4, 2019.

* cited by examiner

TRACK-AND-HOLD CIRCUIT

TECHNICAL FIELD

The present disclosure relates to a track-and-hold circuit, and more particularly to a track-and-hold circuit having a high sampling rate and reduced power consumption.

BACKGROUND ART

A track-and-hold circuit is also referred to as a sample-and-hold circuit, and is used, for example, to convert an analog signal into a digital signal (for example, see Non-Patent Literature 1). The track-and-hold circuit performs switching between two modes: a track mode when the level of an input clock signal is High, and a hold mode when the level is Low. In the track mode, a voltage signal that is equivalent to an input voltage signal is output as an output signal, and in the hold mode, the voltage value that had been input at the time of switching from the track mode to the hold mode is held and output continuously.

As the output of the track-and-hold circuit, only the value at the time of the hold mode is typically used in the latter circuit. Thus, a master-slave track-and-hold circuit is widely used that connects two track-and-hold circuits in series and outputs only the value at the time of hold (for example, see Non-Patent Literature 2).

CITATION LIST

Non Patent Literature

Non-Patent Literature 1: Shahriar Shahramian, et al. "A 40-GSamples/Sec Track & Hold Amplifier in 0.18 μm SiGe BiCMOS Technology", Compound Semiconductor IC (CSIC) Symposium (CSIC), Digest pp. 101-104, IEEE 2005

Non-Patent Literature 2: Y. Bouvier, et al. "A 1GSample/s, 15 GHz input bandwidth Master-Slave Track-&-Hold Amplifier in InP-DHBT technology", International Microwave Symposium (IMS) 2009, pp. 1137-1140, IEEE 2009

SUMMARY OF THE INVENTION

Technical Problem

In a master-slave track-and-hold circuit, the sampling rate is in an equal relationship to the frequency of the input clock signal. Thus, in order to obtain a high sampling rate, a high clock frequency is required, and there has been a problem in that the power consumption increases and the timing margin decreases.

Means for Solving the Problem

An object of the present disclosure is to provide a track-and-hold circuit with a high sampling rate and reduced power consumption.

In order to achieve such an object, an embodiment of the present disclosure is a track-and-hold circuit performing switching, by using a clock signal, between a track mode in which a data signal that is equivalent to an input data signal is output and a hold mode in which a data signal which is input at a time of switching from the track mode to the hold mode is held and output, such that only the data signal in the hold mode is output, the track-and-hold circuit including: two sampling circuits configured to be connected in parallel to an input of the data signal and receive an in-phase data signal; a clock circuit configured to input a clock signal, which has a phase opposite to a phase of a clock signal input to one of the two sampling circuits, to the other of the two sampling circuits; and a multiplexer circuit configured to select and output a data output of either one of the two sampling circuits that is in the hold mode, by using the clock signal.

Further, as the current sources of the two sampling circuits, one current source is shared.

Effects of the Invention

According to the present disclosure, two sampling circuits are connected in parallel, and a multiplexer circuit selects and outputs data outputs of the sampling circuits in the hold mode, so that a sampling rate that is twice the frequency of an input clock signal can be obtained. Further, sharing the current source between the two sampling circuits allows the power consumption to be reduced.

DESCRIPTION OF EMBODIMENTS

Hereinafter, embodiments of the present disclosure will be described in detail with reference to the drawings.

First Embodiment

Figure 1:
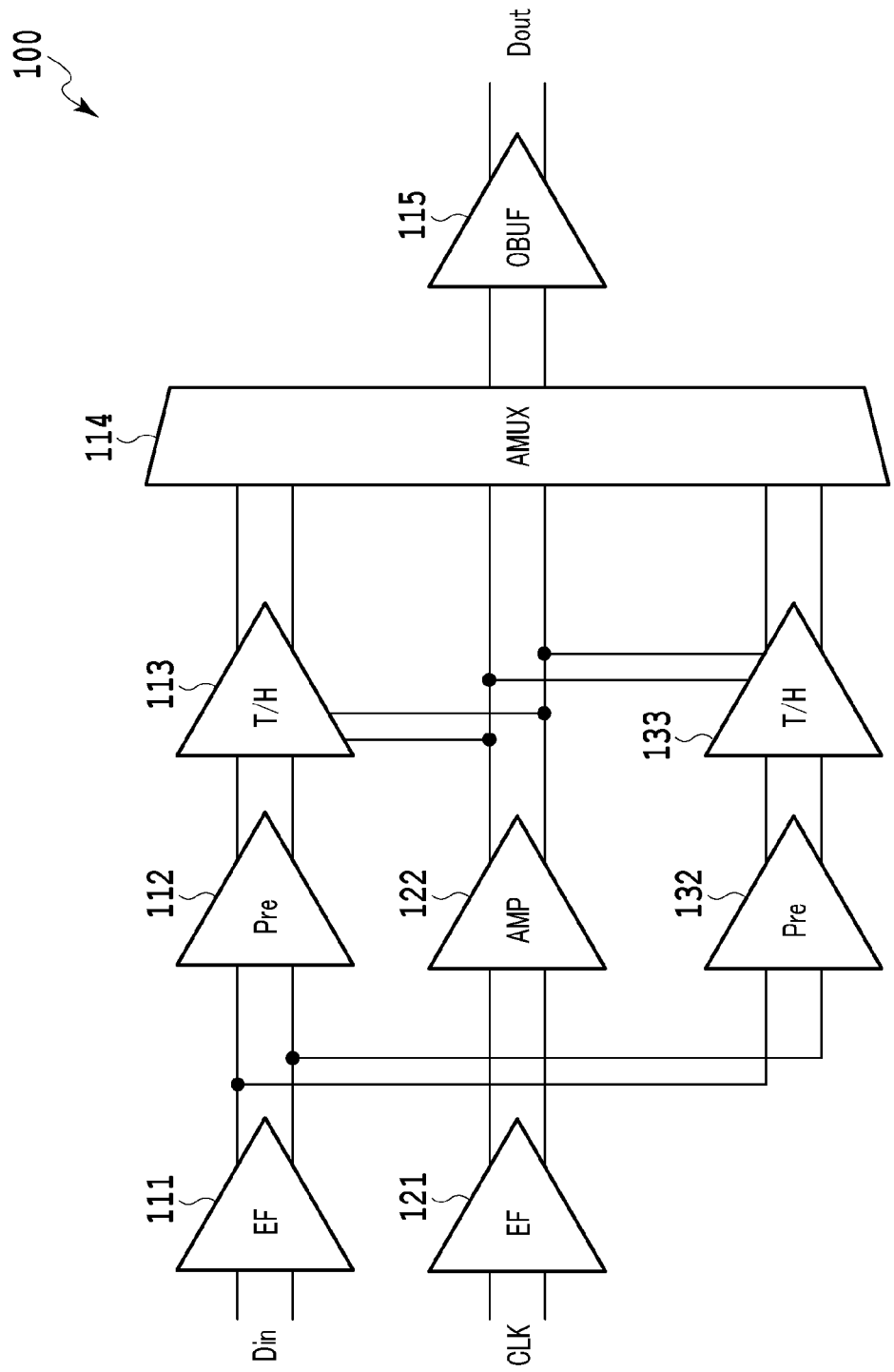
FIG. 1 is a diagram illustrating a track-and-hold circuit according to a first embodiment of the present disclosure.

FIG. 1 illustrates a track-and-hold circuit according to a first embodiment of the present disclosure. A track-and-hold circuit 100 has a configuration in which a data input buffer circuit 111 connected to a Data input (Din), two-system preamplifier circuits 112, 132, two-system sampling circuits 113, 133, a multiplexer circuit 114, and an output buffer circuit 115 are cascaded. The track-and-hold circuit 100 further includes a clock input buffer circuit 121 connected to a clock input (CLK), and a clock signal amplification circuit 122 (both components are collectively referred to as a clock circuit), with the clock signal amplification circuit 122 supplying a clock signal to the sampling circuits 113, 133 and the multiplexer circuit 114.

The data input buffer circuit 111 and the clock input buffer circuit 121 generally employ an Emitter Follower (EF) circuit.

The preamplifier circuits 112, 132 are differential amplifiers for adjusting the data output of the data input buffer circuit 111 to a common mode voltage suitable for sampling at the sampling circuits 113, 133.

The clock signal amplification circuit 122 is a circuit that performs amplifying and waveform shaping of the clock signal output from the clock input buffer circuit 121 to a common mode voltage suitable for input to the sampling circuits 113, 133. Other than the operations of the sampling circuits 113, 133 and the multiplexer circuit 114, a known circuit configuration may be applied.

An in-phase data signal is input to each of the two-system sampling circuits 113, 133, and a clock signal that is input to the sampling circuit 113 and a clock signal input to the sampling circuit 133 are signals having opposite phases to each other.

The multiplexer circuit 114 selects, by using the input clock signal, between the data outputs when the sampling circuits 113, 133 are in the hold mode and outputs a selected data output to the output buffer circuit 115.

With such a configuration, two-system sampling circuits are connected in parallel and receive clock signals having opposite phases to each other, so that input data signals to the two-system sampling circuits are alternately held. By the multiplexer circuit switching the outputs of the two-system sampling circuits alternately, only the value in the hold mode is output.

Figure 2:
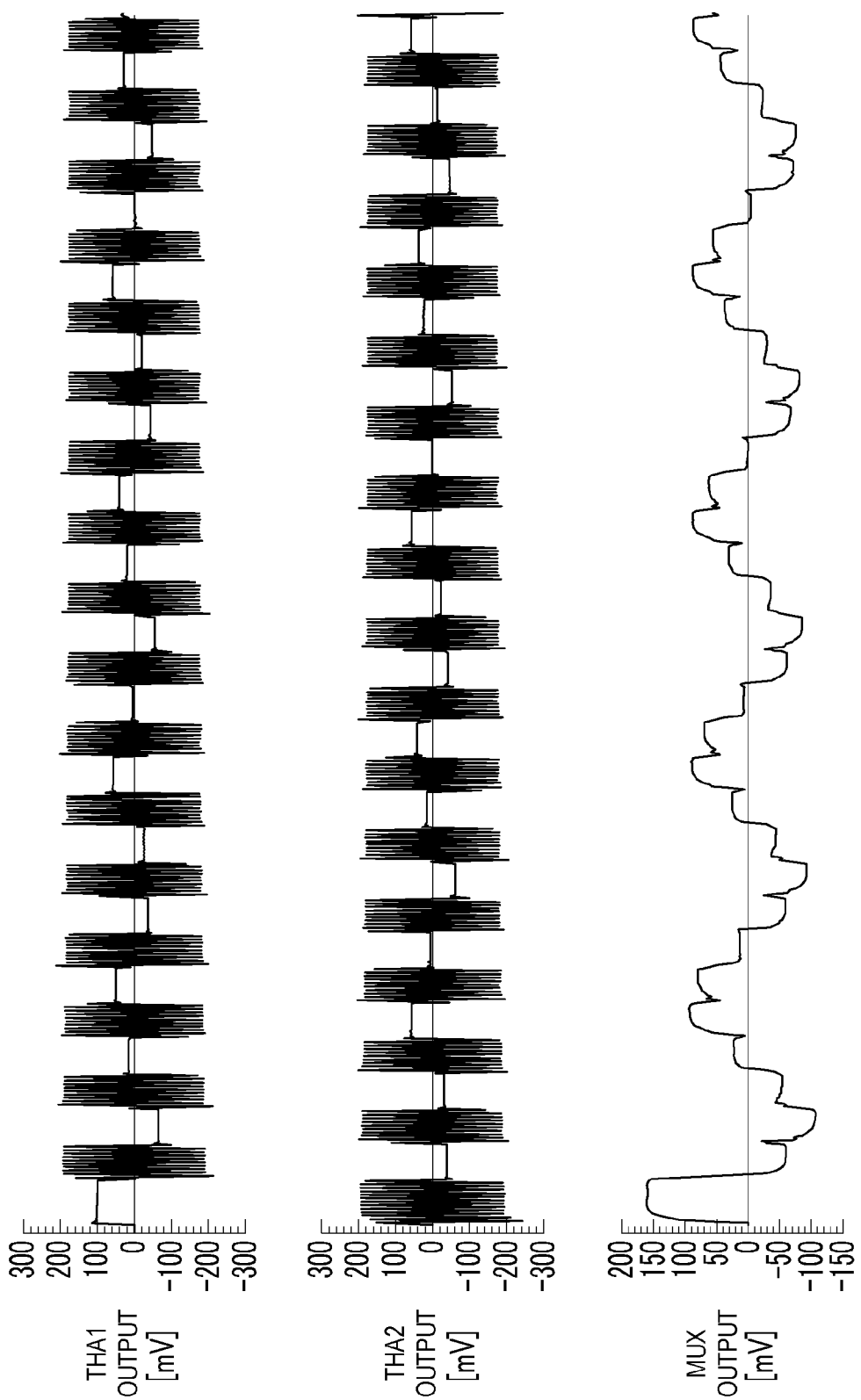
FIG. 2 is a diagram illustrating outputs of sampling circuits and a multiplexer circuit of the track-and-hold circuit according to the first embodiment.

FIG. 2 illustrates outputs of the sampling circuits and the multiplexer circuit of the track-and-hold circuit according to the first embodiment. FIG. 2 illustrates the case of undersampling with a clock frequency lower than the input data rate. It can be seen that the output THA1 of the sampling circuit 113 and the output THA2 of the sampling circuit 133 vary greatly in signal amplitude in the track mode and maintains a constant voltage at the time of mode switching, in the hold mode. As the output MUX of the multiplexer circuit 114, constant voltage when the output THA1 and the output THA2 are in the hold mode is output.

According to the first embodiment, a sampling rate of twice the frequency of the clock signal can be obtained by connecting the two-system sampling circuits in parallel and switching the outputs.

Figure 3:
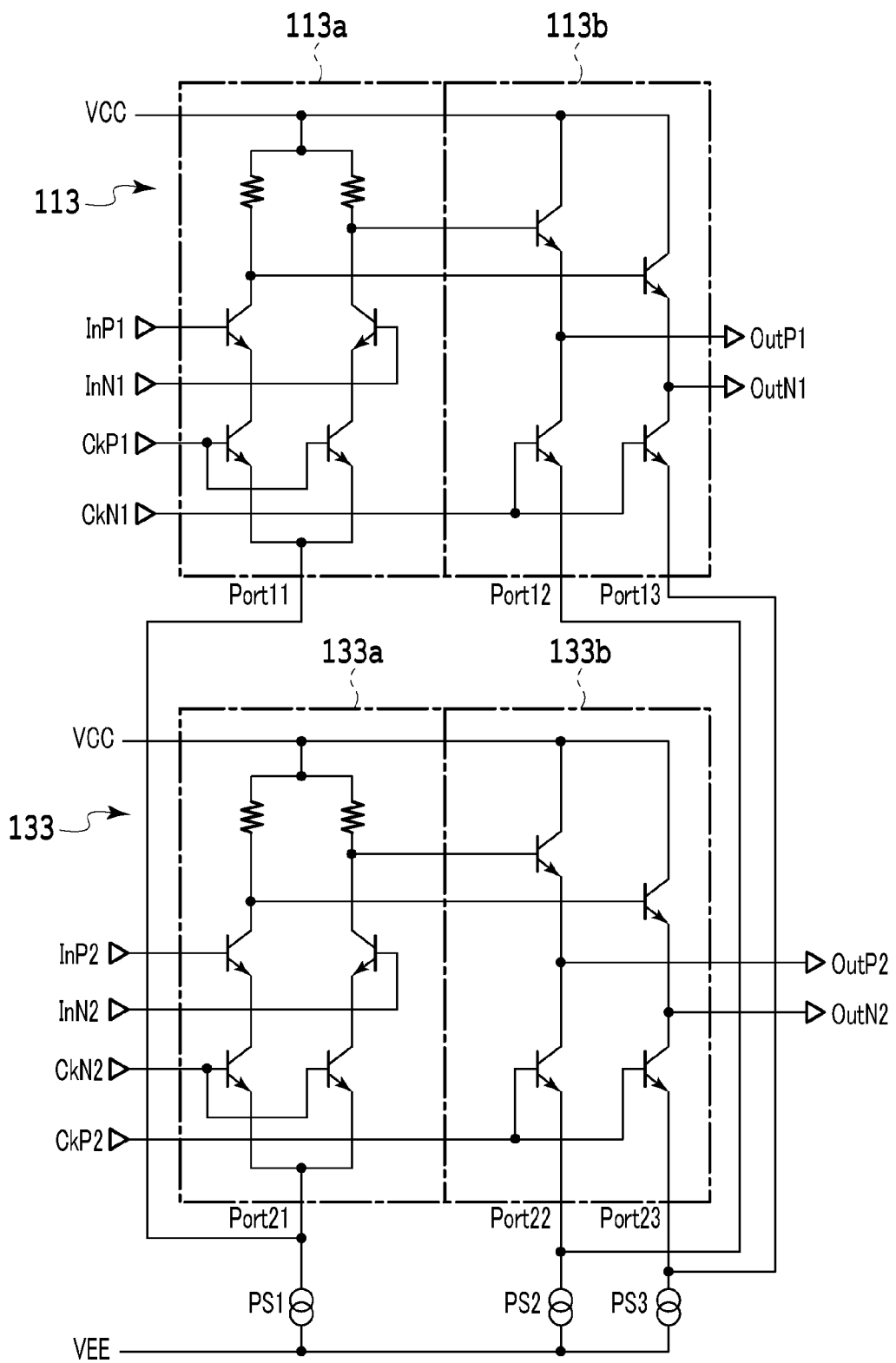
FIG. 3 is a diagram illustrating a circuit configuration of the sampling circuit according to the first embodiment.

FIG. 3 illustrates a circuit configuration of the sampling circuit according to the first embodiment. FIG. 3 is a diagram illustrating a part of the track portions and the hold portions of the sampling circuits 113, 133 which are extracted from the configuration of FIG. 1 (the capacitors of the hold portion and the circuit of the output stage of the hold portion are omitted). The output of the preamplifier circuit 112 is connected to the inputs InP1, InN1 of the track portion 113a of the sampling circuit 113. The output of the preamplifier circuit 132 is connected to the inputs InP2, InN2 of the track portion 133a of the sampling circuit 133. As described above, an in-phase data signal is input to each of the sampling circuits 113, 133. The outputs of the clock signal amplification circuit 122 which are input to the clock inputs CkP1, CkN1 of the track portion 113a of the sampling circuit 113 and the clock inputs CkN2, CkP2 of the track portion 133a of the sampling circuit 133 have opposite phases to each other.

With such a configuration, the sampling circuit 133 operates in the hold mode when the sampling circuit 113 is in the track mode. When the sampling circuit 113 is in the hold mode, the sampling circuit 133 operates in the track mode.

Here, as the current source of the track portion 113a and the current source of the track portion 133a, one current source PS1 is shared via Port 11 and Port 21. Similarly, the current source of the hold portion 113b and the current source of the hold portion 133b are shared with the current sources PS2, PS3 via Ports 12, 22 and Ports 13, 23 respectively.

Figure 4:
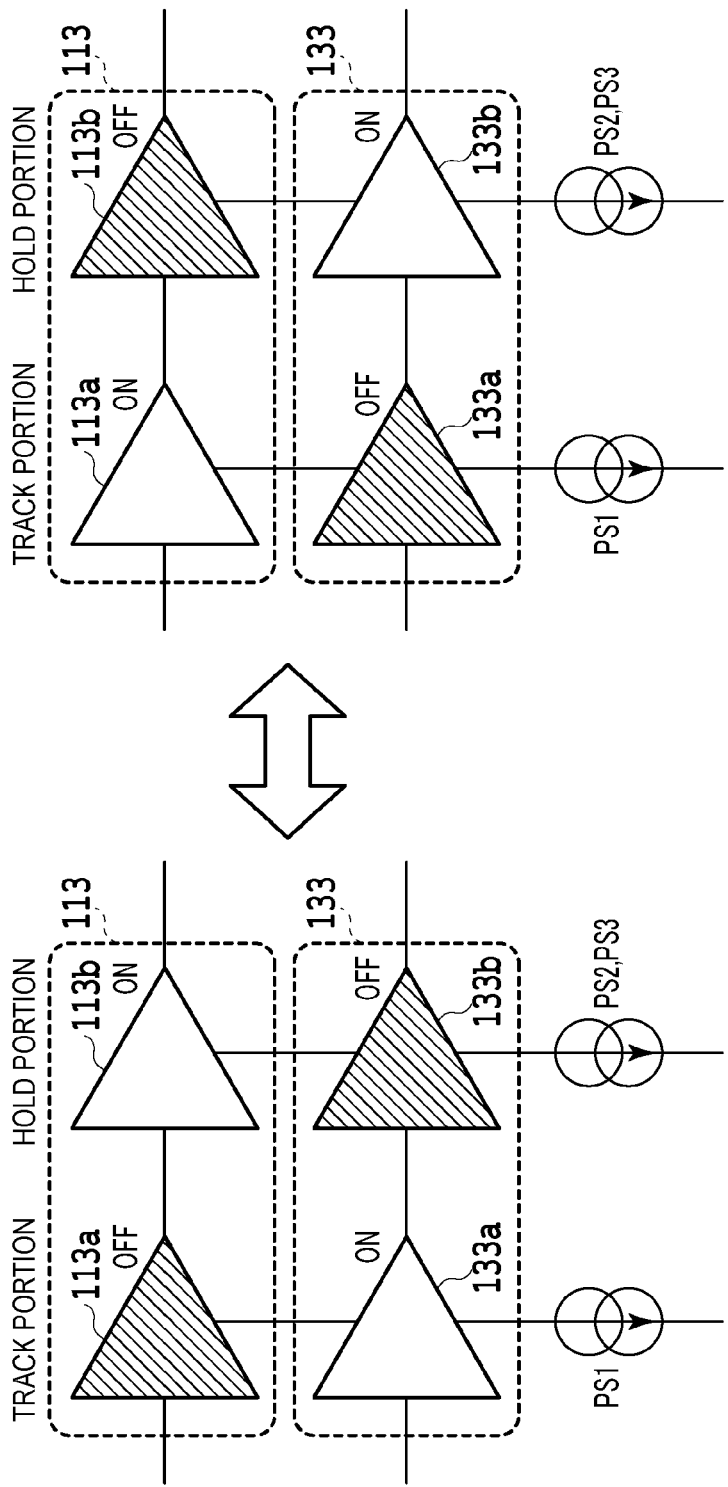
FIG. 4 is a diagram illustrating an operating relationship of two sampling circuits according to the first embodiment.

FIG. 4 illustrates an operating relationship of two sampling circuits. The blank portions indicate that current flows and the portions are operating, and the shaded portions indicate that no current flows and the portions are not operating. For example, when explaining the operation of only the track portions, in the case of a left side of FIG. 4, the current flows only in the track portion 133a because the track portion 113a of the sampling circuit 113 is OFF and the track portion 133a of the sampling circuit 133 is ON. The right side of FIG. 4 illustrates, conversely, a current flowing only in the track portion 113a of the sampling circuit 113.

Similarly, the hold portions 113b, 133b operate in an alternating manner between the two sampling circuits as well. Thus, current necessary for operating only one sampling circuit suffices for a current source, whereby the power consumption of the sampling circuit can be reduced by half.

As illustrated in FIG. 2 of Non-Patent Literature 1, a general sampling circuit is divided into a track portion connected to inputs I_P, I_N and a hold portion connected to outputs O_P, O_N, and a current source that supplies a current determined by Iref is connected to the track portion and the hold portion respectively.

As illustrated in FIG. 4 of Non-Patent Literature 2, a Switched Emitter Follower (SEF) circuit is used in the output stage of the hold portion, and in the hold mode (when CLKb2 is High), the current is bypassed to a bypass resistor (the right-most resistor in FIG. 4).

According to the first embodiment, at least one current source among the current sources used in the track portion and the hold portion included in the sampling circuit is shared between the two sampling circuits, so that power consumption can be halved. In addition, when the sampling circuit is in the hold mode, there is no need to provide a bypass path because the current is bypassed through the shared current source.

Second Embodiment

Figure 5:
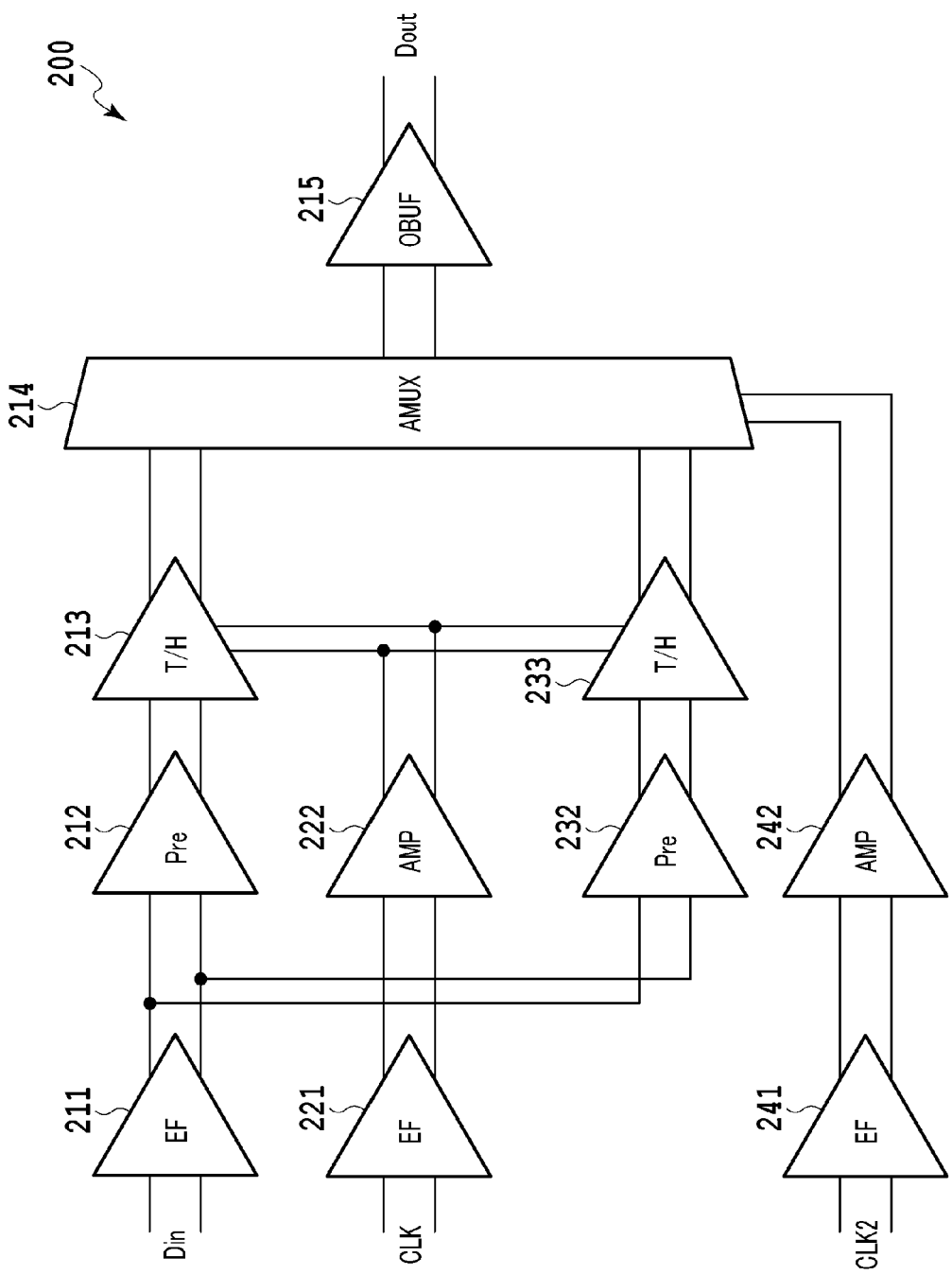
FIG. 5 is a diagram illustrating a track-and-hold circuit according to a second embodiment of the present disclosure.

FIG. 5 illustrates a track-and-hold circuit according to a second embodiment of the present disclosure. The track-and-hold circuit 200 has a configuration in which a data input buffer circuit 211 connected to a Data input (Din), two-system preamplifier circuits 212, 232, two-system sampling circuits 213, 233, a multiplexer circuit 214, and an output buffer circuit 215 are cascaded. Further, a clock signal is supplied to the sampling circuits 213, 233 by a clock input buffer circuit 221 connected to a clock input (CLK) and a clock signal amplification circuit 222 (both components are collectively referred to as a first clock circuit). Further, a clock signal is supplied to the multiplexer circuit 214 by a clock input buffer circuit 241 connected to a clock input 2 (CLK2) and a clock signal amplification circuit 242 (both components are collectively referred to as a second clock circuit). That is, the present embodiment differs from the first embodiment in that the clock signal of the sampling circuits and the clock signal of the multiplexer circuit are from different systems.

As illustrated in FIG. 5, the clock signal input to the sampling circuits and the clock signal input to the multiplexer circuit are from different systems, so that the operation of the multiplexer circuit may be determined regardless of the operation of the sampling circuits. For example, one sampling circuit can be fixed in a track mode and caused to output a signal, hence transmission characteristics, reflection characteristics, or the like as the track-and-hold circuit can be evaluated.

REFERENCE SIGNS LIST 100, 200 Track-and-hold circuit
111, 211 Input buffer circuit 112, 132, 212, 232 Preamplifier circuit
113, 133, 213, 233 Sampling circuit
113*a*, 133*a* Track portion
113*b*, 133*b* Hold portion
114, 214 Multiplexer circuit
115, 215 Output buffer circuit
121, 221, 241 Clock input buffer circuit
122, 222, 242 Clock signal amplification circuit

The invention claimed is:

1. A track-and-hold circuit performing switching, by using a clock signal, between a track mode in which a data signal that is equivalent to an input data signal is output and a hold mode in which a data signal which is input at a time of switching from the track mode to the hold mode is held and output, such that only the data signal in the hold mode is output, the track-and-hold circuit comprising:
   two sampling circuits configured to be connected in parallel to an input of the data signal and receive an in-phase data signal;
   a clock circuit configured to input a clock signal, which has a phase opposite to a phase of a clock signal input to one of the two sampling circuits, to the other of the two sampling circuits; and
   a multiplexer circuit configured to select and output a data output of either one of the two sampling circuits that is in the hold mode, by using the clock signal,
   wherein one or more current sources among current sources used in the two sampling circuits are shared between the two sampling circuits.

2. A track-and-hold circuit performing switching, by using a clock signal, between a track mode in which a data signal that is equivalent to an input data signal is output and a hold mode in which a data signal which is input at a time of switching from the track mode to the hold mode is held and output, such that only the data signal in the hold mode is output, the track-and-hold circuit comprising:
   two sampling circuits configured to be connected in parallel to an input of the data signal and receive an in-phase data signal;
   a first clock circuit configured to input a clock signal, which has a phase opposite to a phase of a clock signal input to one of the two sampling circuits, to the other of the two sampling circuits;
   a second clock circuit configured to input a second clock signal different from the clock signal to a sampling circuit; and
   a multiplexer circuit configured to select and output a data output of either one of the two sampling circuits that is in the hold mode, by using the second clock signal.

3. The track-and-hold circuit of claim 2,
   wherein one or more current sources among current sources used in the two sampling circuits are shared between the two sampling circuits.

4. A track-and-hold circuit configured to switch between a track mode in which a data signal that is equivalent to an input data signal is output and a hold mode in which a data signal which is input at a time of switching from the track mode to the hold mode is held and output, such that only the data signal in the hold mode is output, the track-and-hold circuit comprising:
   a first sampling circuit having a first input and a second sampling circuit having a second input, wherein the first and second sampling circuits are connected in parallel, wherein the first and second sampling circuits are configured to receive an in-phase data signal at the first input and at the second input;
   a clock circuit configured to input a clock signal to the first sampling circuit and input a clock signal to the second sampling circuit, wherein the clock signal input to the first sampling circuit has a phase opposite to a phase of the clock signal input to the second sampling circuit; and
   a multiplexer circuit configured to select and output a data output of either one of the first and second sampling circuits that is in the hold mode using the clock circuit,
   wherein one or more current sources among current sources used in the first and second sampling circuits are shared between the first and second sampling circuits.

* * * * *